United States Patent [19]

Kinoshita et al.

[11] Patent Number: 5,173,130
[45] Date of Patent: Dec. 22, 1992

[54] PROCESS FOR SURFACE TREATMENT OF COPPER AND COPPER ALLOY

[75] Inventors: Masashi Kinoshita, Marugame; Takayuki Murai, Kagawa; Takashi Yoshioka, Marugame, all of Japan

[73] Assignee: Shikoku Chemicals Corporation, Marugame, Japan

[21] Appl. No.: 611,660

[22] Filed: Nov. 13, 1990

[30] Foreign Application Priority Data

Nov. 13, 1989 [JP] Japan .................................. 1-295253
Jul. 7, 1990 [JP] Japan .................................. 2-180239
Aug. 10, 1990 [JP] Japan .................................. 2-212285

[51] Int. Cl.$^5$ .......................................... C23C 22/06
[52] U.S. Cl. .................................. 148/268; 148/269; 106/14.15

[58] Field of Search .............................. 148/269, 268; 106/14.15

[56] References Cited

U.S. PATENT DOCUMENTS

| | | | |
|---|---|---|---|
| 3,933,531 | 1/1976 | Sawa | 148/269 |
| 4,395,294 | 7/1983 | Hobbins | 148/269 |
| 4,731,128 | 3/1988 | Casullo | 148/269 |

*Primary Examiner*—Sam Silverberg
*Attorney, Agent, or Firm*—Sherman and Shalloway

[57] ABSTRACT

Disclosed is a process for the surface treatment of copper or a copper alloy, which comprises immersing the surface of copper or a copper alloy in an aqueous solution containing a benzimidazole compound having an alkyl group of at least 3 carbon atoms at the 2-position and an organic acid.

15 Claims, No Drawings

PROCESS FOR SURFACE TREATMENT OF COPPER AND COPPER ALLOY

BACKGROUND OF THE INVENTION (1) Field of the Invention

The present invention relates to a process for forming 2-alkylbenzimidazole layer (hereinafter referred to as "chemically formed layer") having an excellent heat resistance on the surface of copper or a copper alloy. More particularly, the present invention provides a process suitably used for the preflux treatment of copper on printed circuit board or a flexible printed circuit board.

(2) Description of the Related Art

Processes for chemically forming a layer of an imidazole compound having a long-chain alkyl group at the 2-position on the surface of copper or a copper alloy are disclosed, for example, in Japanese Examined Patent Publication No. 46-17046, No. 48-11454, No. 48-25621, No. 49-1983, No. 49-26183, No. 58-22545 and No. 61-41988, and Japanese Unexamined Patent Publication No. 61-90492.

Furthermore, as the method for forming a chemically formed layer of a benzimidazole compound, Japanese Unexamined Patent Publication No. 58-501281 discloses a method using 5-methylbenzimidazole.

Recently, as the method of bonding electronic components to a printed circuit board, there has been frequently adopted a surface mounting technique and surface mount technology (SMT) was taken in order to obtain high density packaging of electric components on the printed circuit board. In this technology, the printed circuit board is exposed to high temperature due to reflow soldering, temporary fixing of chip components, and double-sided surface mounting of electric components.

However, the conventional chemically formed layer of an imidazole having a long-chain alkyl group at the 2-position, which is selectively formed on copper, is degraded at a high temperature though the film is stable at a temperature close to room temperature, and as a result sometimes, soldering becomes impossible.

In the known method for the surface treatment of copper or copper alloy with a benzimidazole compound, since the benzimidazole compound is easily soluble in water, a chemically formed layer having a desirable thickness, that is, a thickness of at least 0.08 μm, cannot be formed, and the obtained film can hardly exert the function of protecting copper from oxidation and corrosion under heating.

Accordingly, formation of a preflux coating film having a highly improved heat resistance on the surface of copper or copper alloy, which can cope with the method of surface mount technology of a printed circuit board, is eagerly desired.

SUMMARY OF THE INVENTION

Under this background, we made investigations and as the result, it was found that by immersing the surface of copper or a copper alloy in an aqueous solution containing a benzimidazole compound having an alkyl group of at least 3 carbon atoms at the 2-position and an organic acid, a chemically formed layer having an excellent heat resistance can be obtained. We have now completed the present invention based on this finding.

In accordance with the present invention, there is provided a process for the surface treatment of copper or copper alloy, which comprises immersing the surface of copper or a copper alloy in an aqueous solution containing a benzimidazole compound having an alkyl group of at least 3 carbon atoms at the 2-position and an organic acid.

DETAILED DESCRIPTION OF THE PREFERRED EMBODIMENT

Typical compounds used in carrying out the process of the present invention are compounds represented by the following general formula (I):

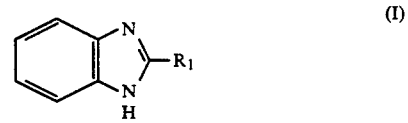

wherein $R_1$ represents an alkyl group having at least 3 carbon atoms.

As specific examples of the compound of this type, there can be mentioned 2-propylbenzimidazole, 2-butylbenzimidazole, 2-pentylbenzimidazole, 2-hexylbenzimidazole, 2-heptylbenzimidazole, 2-octylbenzimidazole, 2-nonylbenzimidazole, 2-undecylbenzimidazole, 2-heptadecylbenzimidazole, and salts thereof.

Furthermore, compounds represented by the following general formula (II) can be used for carrying out the process of the present invention:

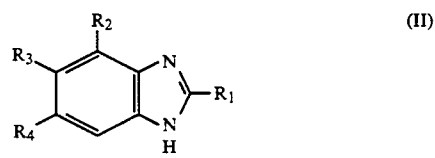

wherein $R_1$ represents an alkyl group having at least 3 carbon atoms, and $R_2$, $R_3$ and $R_4$ represent a lower alkyl group, a halogen atom, a nitro group or a hydrogen atom, with the proviso that at least one of $R_2$, $R_3$ and $R_3$ represents a lower alkyl group, a halogen atom or a nitro group.

As specific examples of the compound of this type, there can be mentioned 2-propyl-5-methylbenzimidazole, 2-propyl-4,5-dimethylbenzimidazole, 2-butyl-5-chlorobenzimidazole, 2-butyl-5-nitrobenzimidazole, 2-pentyl-4-methylbenzimidazole, 2-pentyl-5-methylbenzimidazole, 2-pentyl-5,6-dichlorobenzimidazole, 2-hexyl-5,6-dimethylbenzimidazole, 2-hexyl-5-nitrobenzimidazole, 2-heptyl-4-methylbenzimidazole, 2-heptyl-5-methylbenzimidazole, 2-heptyl-5-chlorobenzimidazole, 2-octyl-5,6-dichlorobenzimidazole, 2-octyl-5-chlorobenzimidazole, 2-nonyl-5-methylbenzimidazole, 2-nonyl-4,5-dimethylbenzimidazole, 2-nonyl-5-nitrobenzimidazole, 2-undecyl-4-methylbenzimidazole, 2-heptadecyl-5-methylbenzimidazole, and salts thereof.

Among the compounds represented by the general formula (II), there are preferably used compounds represented by the following formula (III) and (IV):

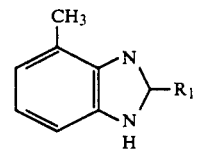

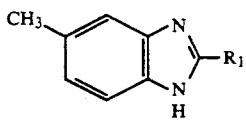

wherein $R_1$ represents an alkyl group having at least 3 carbon atoms,
especially a mixture of 2-propyl-4-methylbenzimidazole and 2-propyl-5-methylbenzimidazole, a mixture of 2-butyl-4-methylbenzimidazole and 2-butyl-5-methylbenzimidazole, a mixture of 2-pentyl-4-methylbenzimidazole and 2-pentyl-5-methylbenzimidazole, a mixture of 2-hexyl-4-methylbenzimidazole and 2-hexyl-5-methylbenzimidazole, a mixture of 2-heptyl-4-methylbenzimidazole and 2-hexyl-5-methylbenzimidazole, a mixture of 2-heptyl-4-methylbenzimidazole and 2-heptyl-5-methylbenzimidazole, a mixture of 2-octyl-4-methylbenzimidazole and 2-octyl-5-methylbenzimidazole, a mixture of 2-nonyl-4-methylbenzimidazole and 2-nonyl-5-methylbenzimidazole, a mixture of 2-undecyl-4-methylbenzimidazole and 2-undecyl-5-methylbenzimidazole, a mixture of 2-heptadecyl-4-methylimidazole and 2-heptadecyl-5-methylbenzimidazole, and salts thereof.

The above-mentioned 2-alkylmethylbenzimidazole mixtures can be easily prepared by reacting a mixture of 2,3-diaminotoluene and 3,4-diaminotoluene with a carboxylic acid.

In the case where a benzimidazole having an alkyl group having a small carbon number is used in carrying out the present invention, a part of the chemically formed layer formed on the surface of copper metal tends to be eluted by the following rinse. When a benzimidazole having an alkyl group having a large carbon number is used, a large amount of an organic acid is necessary for forming the aqueous solution. Accordingly, benzimidazole compounds having an alkyl group of 5 to 9 carbon atoms at the 2-position are especially preferable.

In carrying out the present invention, the alkylbenzimidazole compound is added in an amount 0.01 to 5%, preferably 0.1 to 2%, based on water.

Since the alkylbenzimidazole is hardly soluble in water, in carrying out the present invention, adequate amount of organic acid is needed in order to solve the alkylbenzimidazole and to obtain an aqueous solution.

As the organic acid to be used in carrying out the present invention, there can be mentioned, for example, formic acid, acetic acid, lactic acid, propionic acid, capric acid, glycolic acid, acrylic acid, benzoic acid, p-nitrobenzoic acid, p-butylbenzoic acid, p-toluene-sulfonic acid, picric acid, salicylic acid, m-toluic acid, oxalic acid, succinic acid, maleic acid, fumaric acid, tartaric acid and adipic acid. The organic acid is added in an amount of 0.01 to 15%, preferably 0.2 to 5%, based on water.

In carrying out the present invention, an inorganic acid such as hydrochloric acid, phosphoric acid or nitric acid may be used in combination with an organic acid as mentioned above.

In carrying out the present invention, the surface of copper or a copper alloy is subjected to such a treatment as polishing, degreasing, soft etching or pickling, and then, the metal surface is immersed in the treating solution or the treating solution is coated or sprayed on the metal surface.

At the step of immersing the surface of copper or a copper alloy in an aqueous solution containing the alkylbenzimidazole compound and organic acid in the present invention, the temperature of the aqueous solution is adjusted to about 20° to about 60° C. and the immersing time is adjusted to 1 second to several minutes.

We made further investigations with a view to imparting a higher heat resistance to a chemically formed layer of the 2-alkylbenzimidazole formed on the metal surface in the above-mentioned treatment process, and as the result, it was found that this object can be attained by a method of immersing the surface of copper or a copper alloy in an aqueous solution containing a 2-alkylbenzimidazole compound and an organic acid and followed by the immersing the imidazole coated surface in an aqueous solution containing at least one member selected from the group consisting of zinc compounds and copper compounds (hereinafter referred to as "two-staged treatment method"). It also was found that a method of immersing the surface of copper or a copper alloy in an aqueous solution formed by adding at least one member selected from the group consisting of zinc compounds and copper compounds to an aqueous solution containing a 2-alkylbenzimidazole compound and an organic acid (hereinafter referred to as "one-staged treatment method") can impart a higher heat resistance.

As typical instances of the zinc compound that can be used for this treatment, there can be mentioned zinc oxide, zinc formate, zinc acetate, zinc lactate, zinc citrate, zinc benzoate, zinc salicylate, zinc sulfate, zinc nitrate and zinc phosphate. As typical instances of the copper compound, there can be mentioned cuprous chloride, cupric chloride, copper hydroxide, copper phosphate, copper acetate, copper sulfate, copper nitrate and copper bromide. The zinc or copper compound is added in an amount of 0.02 to 10%, preferably 0.1 to 5%, based on water.

A substance having a buffering action, such as an organic acid, an inorganic acid or aqueous ammonia or an amine, should be added to the aqueous solution containing the zinc compound or copper compound to stabilize the pH value of the solution.

In the two-stage treatment method of the present invention, at the step of immersing copper or the copper alloy with the aqueous solution containing the alkylbenzimidazole compound and organic acid, the temperature of the aqueous solution is adjusted to about 20° to about 60° C. and the contact time is adjusted to 1 second to several minutes. Then, the metal surface having a chemically formed layer formed thereon is immersed in an aqueous solution containing at least one member selected from the group consisting of zinc compounds and copper compounds at a temperature of about 20° to about 60° C. for 5 seconds to several minutes.

The one-staged treatment method of the present invention is carried out in the same manner as described above with respect to the two-staged treatment method except that an aqueous solution formed by adding at least one member selected from the group consisting of zinc compounds and copper compounds to an aqueous solution containing the 2-alkylbenzimidazole compound and organic acid is used.

In the present invention, the treatment can also be carried out by adding a nickel compound and a cobalt compound in addition to the zinc compound and copper compound.

In carrying out the process of the present invention, the heat resistance can be further improved by forming a two-layer structure comprising a thermoplastic resin layer formed on the chemically formed layer.

More specifically, after a chemically formed layer has been formed on the surface of copper or a copper alloy, a thermoplastic resin having an excellent heat resistance, for example, a rosin derivative such as rosin or a rosin ester, a terpene resin derivative such as a terpene resin or a terpene-phenolic resin, or a hydrocarbon resin such as an aromatic hydrocarbon resin, an aliphatic hydrocarbon resin or an alicyclic hydrocarbon resin, is dissolved in a solvent such as toluene, ethyl acetate or IPA, and then the solution is uniformly coated on the chemically formed layer by using a roll coater so that the thickness of the coating film is 1 to 30$\mu$, preferably 2 to 20$\mu$.

If the surface of copper or a copper alloy is immersed in an aqueous solution containing the 2-alkylbenzimidazole and organic acid, a chemically formed layer of the alkylbenzimidazole compound partially converted to a copper complex is formed on the copper surface by the complex-forming reaction between the alkylbenzimidazole compound and copper and by the hydrogen bond and the Van der Waals Force between the alkylbenzimidazole compound molecules.

It is construed that if the chemically formed layer is allowed to stand still or is heated, migration of copper from the copper surface is caused and the majority of the alkylbenzimidazole is converted to an alkylbenzimidazole/copper complex, and the chemically formed layer of the 2-alkylbenzimidazole contains a conjugated benzene ring and therefore, the chemically formed layer is thermally stable.

It also is construed that if the surface or copper or a copper alloy is immersed in an aqueous solution containing the 2-alkylbenzimidazole and organic acid and the treated metal surface is then contacted with an aqueous solution containing a zinc compound, zinc is included into the chemically formed layer from the aqueous solution containing the zinc compound and the majority of the alkylbenzimidazole/copper complex chemically formed layer converted to a chemically formed layer composed of the alkylbenzimidazole/zinc complex having a higher thermal stability than that of the copper complex, though the copper complex is partially contained, with the result that the heat resistance is further improved.

Moreover, it is construed that in the case where the surface of copper or a copper alloy is contacted with an aqueous solution containing the alkylbenzimidazole compound, organic acid and zinc compound, while the chemically formed layer of the alkylbenzimidazole is being formed on the metal surface, zinc is included in the chemically formed layer to form an alkylbenzimidazole/zinc complex, and therefore, the heat resistance of the chemically formed layer is further improved.

In the case where the surface of copper or a copper alloy is immersed in an aqueous solution containing the alkylbenzimidazole compound, organic acid and copper compound, while the chemically formed layer of the alkylbenzimidazole is being formed on the metal surface, the copper ion in the aqueous solution promotes the formation of the alkylbenzimidazole/copper complex and the speed of forming the chemically formed layer is increased.

It is construed that if a copper ion is supplied to the chemically formed layer from the aqueous solution according to the one-staged treatment method or the two-staged treatment method, a homogeneous chemically formed layer of the alkylbenzimidazole/copper complex is formed and therefore, the heat resistance of the chemically formed layer is improved.

The process of the present invention will now be described in detail with reference to the following examples and comparative examples.

In these examples and comparative examples, the thickness of the conversion coating formed on the metal surface was determined in the following manner.

A test piece having a predetermined size was immersed in a 0.5% aqueous solution of hydrochloric acid to elute the alkylimidazole and the concentration of the alkylimidazole in the solution was measured by an ultraviolet spectrophotometer. The thickness of the chemically formed layer was calculated from the measured concentration.

The solder wetting time was determined in the following manner.

A test piece (copper sheet having a size of 5 mm$\times$50 mm$\times$0.3 mm) was degreased. Then, the test piece was subjected to soft etching, and was then immersed in a sample treating solution and heat-treated. Just before the measurement, the test piece was immersed in a post flux (JS-64 supplied by Koki) and the solder wetting time was measured by using a solder wettability tester (SAT-2000 supplied by Resca). The measurement conditions were a solder temperature of 240° C., an immersion depth of 2 mm and an immersion speed of 16 mm/sec.

EXAMPLE 1

The surface of a copper sheet was polished by a wet polishing member, immersed in a 1% aqueous solution of hydrochloric acid for 30 seconds, washed with water and dried to obtain a test piece. This test piece was immersed in an aqueous solution containing 1% of 2-pentylbenzimidazole and 2.5% of acetic acid at a temperature of 50° C. for 30 seconds, taken out from the aqueous solution, washed with water and dries. It was found that a chemically formed layer having a thickness of 0.15 $\mu$m on the surface of the test piece. When this test piece was kept in a humidic chamber maintained at a temperature of 55° C. and a relative humidity of 95% for 500 hours, no corrosion was found on the surface of the copper sheet.

EXAMPLE 2

A test piece composed of a brass sheet which had been polished and pickled in the same manner as described in Example a was immersed in a treating solution having the same composition as that of the solution used in Example 1 at a temperature of 50° C. for 30 seconds, taken out from the treating solution, washed with water and dried. It was found that a chemically formed layer having a thickness of 0.12 $\mu$m on the surface of the test piece. When the test piece was kept for 500 hours in a humidic chamber maintained at a temperature of 55° C. and a relative humidity of 95%, no corrosion was found on the surface of the brass sheet.

EXAMPLE 3

A test piece of a copper sheet which had been degreased and subjected to soft etching was immersed in an aqueous solution containing 1.0% of 2-pentylbenzimidazole and 2.5% of acetic acid at a temperature of 50° C. for 30 seconds, taken out from the treating solution and washed with water. Then, the test piece was immersed in an aqueous solution containing 2.0% of zinc acetate, 0.09% of acetic acid and 0.04% of ammonia at a temperature of 50° C. for 30 seconds, the test piece was washed with water and dried. It was found that a chemically formed layer having a thickness of 0.12 μm on the surface of the test piece.

Just after the above-mentioned treatment, after 96 hours' standing at room temperature and after heating for 96 hours in a humidic chamber maintained at a temperature of 60° C. and a relative humidity of 95%, the solder wettability of the test piece was determined under no heating or after heating at 200° C. for 10 minutes. The obtained data of the wetting time are shown in Table 1.

TABLE 1

| Measurement conditions | Solder Wettability (unit: second) | | |
|---|---|---|---|
| | Test Piece Post Treatment Conditions | | |
| | just after treatment | 96 hours' standing at room temperature | 96 hours' heating at 60° C. and 95% RH |
| no heating | 0.38 | 0.42 | 0.49 |
| heating at 200° C. for 10 minutes | 0.87 | 1.01 | 2.20 |

EXAMPLE 4

The test piece was treated in the same manner as described in Example 3 except that the treatment with the aqueous solution containing zinc acetate, acetic acid and ammonia was not carried out. It was found that a chemically formed layer having a thickness of 0.16 μm on the surface of the test piece. Results of the measurement of the solder wettability of the test piece are shown in Table 2.

TABLE 2

| Measurement conditions | Solder Wettability (unit: second) | | |
|---|---|---|---|
| | Test Piece Post Treatment Conditions | | |
| | just after treatment | 96 hours' standing at room temperature | 96 hours' heating at 60° C. and 95% RH |
| no heating | 0.38 | 0.38 | 0.47 |
| heating at 200° C. for 10 minutes | 0.99 | 1.22 | 2.93 |

EXAMPLE 5

A test piece of a copper sheet which had been degreased and subjected to soft etching was immersed in an aqueous solution containing 1.0% of 2-2-hexylbenzimidazole and 1.0% of formic acid at a temperature of 50° C. for 20 seconds, taken out from the solution and washed with water. Then, the test piece was immersed in an aqueous solution containing 3.0% of zinc formate, 0.09% of acetic acid and 0.04% of ammonia at a temperature of 50° C. for 30 seconds, taken out from the solution and washed with water. It was found that a chemically formed layer having a thickness of 0.26 μm on the surface of the test piece. The solder wetting time was measured in the same manner as described in Example 3. The obtained results are shown in Table 3.

TABLE 3

| Measurement conditions | Solder Wettability (unit: second) | | |
|---|---|---|---|
| | Test Piece Post Treatment Conditions | | |
| | just after treatment | 96 hours' standing at room temperature | 96 hours' heating at 60° C. and 95% RH |
| no heating | 0.39 | 0.40 | 0.45 |
| heating at 200° C. for 10 minutes | 0.88 | 0.98 | 2.04 |

EXAMPLE 6

The procedures of Example 5 were repeated in the same manner except that the treatment with the aqueous solution containing zinc formate, acetic acid and ammonia was not carried out. It was found that a chemically formed layer having a thickness of 0.28 μm on the surface of the test piece. Results of the wettability test are shown in Table 4.

TABLE 4

| Measurement conditions | Solder Wettability (unit: second) | | |
|---|---|---|---|
| | Test Piece Post Treatment Conditions | | |
| | just after treatment | 96 hours' standing at room temperature | 96 hours' heating at 60° C. and 95% RH |
| no heating | 0.44 | 0.45 | 0.48 |
| heating at 200° C. for 10 minutes | 0.93 | 1.04 | 3.06 |

EXAMPLE 7

A test piece of a copper sheet which had been degreased and subjected to soft etching was immersed in an aqueous solution containing 0.5% of 2-heptylbenzimidazole and 0.7% of formic acid at a temperature of 30° C. for 20 seconds, taken out from the solution and washed with water. It was found that a chemically formed layer having a thickness of 0.15 μm on the surface of the test piece. Results of the solder wettability test are shown in Table 5.

TABLE 5

| Measurement conditions | Solder Wettability (unit: second) | | |
|---|---|---|---|
| | Test Piece Post Treatment Conditions | | |
| | just after treatment | 96 hours' standing at room temperature | 96 hours' heating at 60° C. and 95% RH |
| no heating | 0.38 | 0.40 | 0.50 |
| heating at 200° C. for 10 minutes | 0.90 | 0.94 | 2.77 |

EXAMPLE 8

A test piece of a copper sheet which had been degreased and subjected to soft etching was immersed in an aqueous solution containing 2.0% of 2-heptylbenzimidazole, 6.0% of formic acid and 1.5% of zinc acetate at a temperature of 40° C. for 8 seconds, taken out from the solution and washed with water. It was found that a chemically formed layer having a thickness of 0.16 μm on the surface of the test piece. Results of the solder wettability test are shown in Table 6.

TABLE 6

| Measurement conditions | Solder Wettability (unit: second) | | |
| --- | --- | --- | --- |
| | Test Piece Post Treatment Conditions | | |
| | just after treatment | 96 hours' standing at room temperature | 96 hours' heating at 60° C. and 95% RH |
| no heating | 0.38 | 0.38 | 0.41 |
| heating at 200° C. for 10 minutes | 0.87 | 1.01 | 1.88 |

EXAMPLE 9

A test piece of a copper sheet which had been degreased and subjected to soft etching was immersed in an aqueous solution containing 0.5% of 2-nonylbenzimidazole 5.0% of formic acid and 0.8% of zinc acetate at a temperature of 40° C. for 6 seconds, taken out from the solution and washed with water. It was found that a chemically formed layer having a thickness of 0.20 μm on the surface of the test piece. Results of the solder wettability test are shown in Table 7.

TABLE 7

| Measurement conditions | Solder Wettability (unit: second) | | |
| --- | --- | --- | --- |
| | Test Piece Post Treatment Conditions | | |
| | just after treatment | 96 hours' standing at room temperature | 96 hours' heating at 60° C. and 95% RH |
| no heating | 0.41 | 0.42 | 0.49 |
| heating at 200° C. for 10 minutes | 0.99 | 1.08 | 1.81 |

EXAMPLE 10

A test piece of a copper sheet which had been degreased and subjected to soft etching was immersed in an aqueous solution containing 0.1% of 2-undecylbenzimidazle and 9.2% of acetic acid at a temperature of 40° C. for 40 seconds, taken out from the solution and washed with water. It was found that a chemically formed layer having a thickness of 0.17 μm on the surface of the test piece. Results of the solder wettability test are shown in Table 8.

TABLE 8

| Measurement conditions | Solder Wettability (unit: second) | | |
| --- | --- | --- | --- |
| | Test Piece Post Treatment Conditions | | |
| | just after treatment | 96 hours' standing at room temperature | 96 hours' heating at 60° C. and 95% RH |
| no heating | 0.41 | 0.41 | 0.45 |
| heating at 200° C. for 10 minutes | 0.97 | 0.98 | 1.73 |

EXAMPLE 11

A test piece of a copper sheet which had been degreased and subjected to soft etching was immersed in an aqueous solution containing 0.1% of 2-heptadecylbenzimidazole and 18.5% of acetic acid at a temperature of 40° C. for 60 seconds, taken out from the solution and washed with water. It was found that a chemically formed layer having a thickness of 0.16 μm on the surface of the test piece. Results of the solder wettability test are shown in Table 9.

TABLE 9

| Measurement conditions | Solder Wettability (unit: second) | | |
| --- | --- | --- | --- |
| | Test Piece Post Treatment Conditions | | |
| | just after treatment | 96 hours' standing at room temperature | 96 hours' heating at 60° C. and 95% RH |
| no heating | 0.41 | 0.42 | 0.48 |
| heating at 200° C. for 10 minutes | 0.97 | 1.04 | 1.79 |

EXAMPLE 12

A test piece of a copper sheet which had been degreased and subjected to soft etching was immersed in an aqueous solution containing 0.5% of 2-nonylbenzimidazole and 5.0% of formic acid at a temperature of 50° C. for 30 seconds, taken out from the solution and washed with water. It was found that a chemically formed layer having a thickness of 0.20 μm on the surface of the test piece. Results of the solder wettability test are shown in Table 10.

TABLE 10

| Measurement conditions | Solder Wettability (unit: second) | | |
| --- | --- | --- | --- |
| | Test Piece Post Treatment Conditions | | |
| | just after treatment | 96 hours' standing at room temperature | 96 hours' heating at 60° C. and 95% RH |
| no heating | 0.52 | 0.63 | 0.66 |
| heating at 200° C. for 10 minutes | 1.12 | 1.53 | 4.04 |

EXAMPLE 13

A test piece of a copper sheet which had been degreased and subjected to soft etching was immersed in an aqueous solution containing 0.2% of 2-nonylbenzimidazole, 5% of acetic acid and 0.1% of cupric chloride at a liquid temperature 50° C. for 5 seconds, taken out from the solution and washed with water. It was found that a chemically formed layer having a thickness of 0.28 μm on the surface of the test piece. Results of the solder wettability test are sown in Table 11.

TABLE 11

| Measurement conditions | Solder Wettability (unit: second) | | |
| --- | --- | --- | --- |
| | Test Piece Post Treatment Conditions | | |
| | just after treatment | 96 hours' standing at room temperature | 96 hours' heating at 60° C. and 95% RH |
| no heating | 0.41 | 0.42 | 0.58 |
| heating at 200° C. for 10 minutes | 0.99 | 1.11 | 2.42 |

EXAMPLE 14

A test piece of a copper sheet which had been degreased and subjected to soft etching was immersed in an aqueous solution containing 0.8% of 2-heptylbenzimidazole, 6% of formic acid and 0.2% of copper acetate at a liquid temperature of 50° C. for 5 seconds, taken out from the solution and washed with water. It was found that a chemically formed layer having a thickness of 0.24 μm on the surface of the test piece.

Results of the solder wettability test are shown in Table 12.

TABLE 12

| Measurement conditions | Solder Wettability (unit: second) | | |
|---|---|---|---|
| | Test Piece Post Treatment Conditions | | |
| | just after treatment | 96 hours' standing at room temperature | 96 hours' heating at 60° C. and 95% RH |
| no heating | 0.42 | 0.42 | 0.49 |
| heating at 200° C. for 10 minutes | 1.01 | 1.18 | 2.28 |

EXAMPLE 15

A test piece of a copper sheet which had been degreased and subjected to soft etching was immersed in an aqueous solution containing 1.0% of 2-propylbenzimidazole and 1.0% of acetic acid at a liquid temperature of 50° C. for 1 minute, taken out from the solution and washed with water. It was found that a chemically formed layer having a thickness of 0.17 μm on the surface of the test piece. Results of the solder wettability test are shown in Table 13.

TABLE 13

| Measurement conditions | Solder Wettability (unit: second) | | |
|---|---|---|---|
| | Test Piece Post Treatment Conditions | | |
| | just after treatment | 96 hours' standing at room temperature | 96 hours' heating at 60° C. and 95% RH |
| no heating | 0.41 | 0.41 | 0.49 |
| heating at 200° C. for 10 minutes | 1.07 | 1.30 | 2.81 |

EXAMPLE 16

A test piece of a copper sheet which had been degrease and subjected to soft etching was immersed in an aqueous solution containing 0.5% of 2-nonyl-5-methylbenzimidazle and 6.0% of formic acid at a liquid temperature of 50° C. for 30 seconds, taken out from the solution and washed with water. It was found that a chemically and formed layer having a thickness of 0.20 μm on the surface of the test piece. Results of the solder wettability test are shown in Table 14.

TABLE 14

| Measurement conditions | Solder Wettability (unit: second) | | |
|---|---|---|---|
| | Test Piece Post Treatment Conditions | | |
| | just after treatment | 96 hours' standing at room temperature | 96 hours' heating at 60° C. and 95% RH |
| no heating | 0.52 | 0.63 | 0.66 |
| heating at 200° C. for 10 minutes | 1.21 | 1.61 | 4.09 |

EXAMPLE 17

A test piece of a copper sheet which had been degreased and subjected to soft etching was immersed in an aqueous solution containing 2.0% of 2-heptyl-5-nitrobenzimidazole, 7.0% of formic acid and 1.5% of zinc acetate at a liquid temperature of 40° C. for 8 seconds, taken out from the solution and washed with water. It was found that a chemically formed layer having a thickness of 0.16 μm on the surface of the test piece. Results of the solder wettability test are shown in Table 15.

TABLE 15

| Measurement conditions | Solder Wettability (unit: second) | | |
|---|---|---|---|
| | Test Piece Post Treatment Conditions | | |
| | just after treatment | 96 hours' standing at room temperature | 96 hours' heating at 60° C. and 95% RH |
| no heating | 0.38 | 0.38 | 0.41 |
| heating at 200° C. for 10 minutes | 0.91 | 1.11 | 1.91 |

EXAMPLE 18

A test piece of a copper sheet which had been degreased and subjected to soft etching was immersed in an aqueous solution containing 0.8% of 2-heptyl-5-chlorobenzimidazole, 7% of formic acid and 0.20% of copper acetate at a liquid temperature of 50° C. for 5 seconds, taken out from the solution and washed with water. It was found that a chemically formed layer having a thickness of 0.24 μm on the surface of the test piece. Results of the solder wettability test are shown in Table 16.

TABLE 16

| Measurement conditions | Solder Wettability (unit: second) | | |
|---|---|---|---|
| | Test Piece Post Treatment Conditions | | |
| | just after treatment | 96 hours' standing at room temperature | 96 hours' heating at 60° C. and 95% RH |
| no heating | 0.42 | 0.42 | 0.49 |
| heating at 200° C. for 10 minutes | 1.15 | 1.29 | 2.66 |

EXAMPLE 19

A test piece of a copper sheet which had been degreased and subjected to soft etching was immersed in an aqueous solution containing 0.2% of 2-nonyl-5,6-dimethylbenzimidazole, 6% of acetic acid and 0.1% of cupric chloride at a liquid temperature of 60° C. for 5 seconds, taken out from the solution and washed with water. It was found that a chemically formed layer having a thickness of 0.28 μm on the surface of the test piece. Results of the solder wettability test are shown in Table 17.

TABLE 17

| Measurement conditions | Solder Wettability (unit: second) | | |
|---|---|---|---|
| | Test Piece Post Treatment Conditions | | |
| | just after treatment | 96 hours' standing at room temperature | 96 hours' heating at 60° C. and 95% RH |
| no heating | 0.41 | 0.42 | 0.58 |
| heating at 200° C. for 10 minutes | 1.05 | 1.21 | 2.99 |

EXAMPLE 20

A test piece of a copper sheet which had been degreased and subjected to soft etching was immersed in an aqueous solution containing 0.35% of 2-octyl-4-methylbenzimidazole, 0.35% of 2-octyl-5-methylbenzimidazole, 4.0% of formic acid and 0.8% of zinc acetate at a liquid temperature of 40° C. for 13 seconds, taken out from the solution and washed with water. It was found that a chemically formed layer having a thickness of 0.20 μm on the surface of the test piece. Results of the solder wettability test are shown in Table 18.

TABLE 18

| Measurement conditions | Solder Wettability (unit: second) Test Piece Post Treatment Conditions | | |
|---|---|---|---|
| | just after treatment | 96 hours' standing at room temperature | 96 hours' heating at 60° C. and 95% RH |
| no heating | 0.40 | 0.41 | 0.48 |
| heating at 200° C. for 10 minutes | 0.66 | 0.69 | 1.07 |
| heating at 200° C. for 15 minutes | 0.99 | 1.09 | 2.14 |

EXAMPLE 21

A test piece of a copper sheet which had been degreased and subjected to soft etching was immersed in an aqueous solution containing 0.12% of 2-nonyl-4-methylbenzimidazole, 0.08% of 2-nonyl-5-methylbenzimidazole, 5.0% of acetic acid and 0.1% of cupric chloride at a liquid temperature of 50° C. for 7 seconds, taken out from the solution and washed with water. It was found that t chemically formed layer having a thickness of 0.28 μm on the surface of the test piece. Results of the solder wettability test are shown in Table 19.

TABLE 19

| Measurement conditions | Solder Wettability (unit: second) Test Piece Post Treatment Conditions | | |
|---|---|---|---|
| | just after treatment | 96 hours' standing at room temperature | 96 hours' heating at 60° C. and 95% RH |
| no heating | 0.41 | 0.42 | 0.58 |
| heating at 200° C. for 10 minutes | 0.68 | 0.70 | 1.01 |
| heating at 200° C. for 15 minutes | 0.96 | 0.95 | 1.88 |

COMPARATIVE EXAMPLE

A test piece of a copper sheet which had been degreased and subjected to soft etching was immersed in an aqueous solution containing 0.5% of 2-undecylimidazole and 1.6% of acetic acid at a liquid temperature of 50° C. for 20 seconds, taken out from the solution and washed with water. It was found that a chemically formed layer having a thickness of 0.23 μm on the surface of the test piece. Results of the solder wettability test conducted in the same manner as in the preceding examples are shown in Table 20.

TABLE 20

| Measurement conditions | Solder Wettability (unit: second) Test Piece Post Treatment Conditions | | |
|---|---|---|---|
| | just after treatment | 96 hours' standing at room temperature | 96 hours' heating at 60° C. and 95% RH |
| no heating | 0.40 | 0.43 | 1.39 |
| heating at 200° C. for | 9.43 | >10 | >10 |

TABLE 20-continued

| Measurement conditions | Solder Wettability (unit: second) Test Piece Post Treatment Conditions | | |
|---|---|---|---|
| | just after treatment | 96 hours' standing at room temperature | 96 hours' heating at 60° C. and 95% RH |
| 10 minutes | | | |

As is apparent from the foregoing description, according to the process of the present invention, a heat-resistant chemically formed layer composed mainly of an alkylbenzimidazole compound can be obtained on the surface of copper or a copper alloy, and the process of the present invention is especially effective for improving the soldability in the surface packaging of a printed circuit board.

We claim:

1. A process for forming a chemically formed layer on the surface of copper or a copper alloy to be soldered, wherein the layer protects the copper or the copper alloy from oxidation upon heating, which comprises immersing the surface of the copper or the copper alloy in an aqueous solution containing a benzimidazole compound and an organic acid, wherein the benzimidazole compound has an alkyl group of at least 3 carbon atoms at the 2-position and has the formula

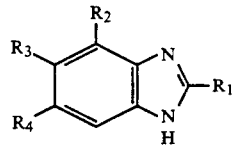

wherein $R_1$ represents an alkyl group having at least 3 carbon atoms, and $R_2$, $R_3$ and $R_4$ represent a lower alkyl group, a halogen atom, a nitro group or a hydrogen atom.

2. A process according to claim 1, wherein the alkylbenzimidazole compound is a compound represented by the following general formula (I):

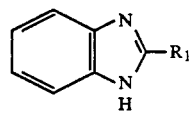

wherein $R_1$ represents an alkyl group having at least 3 carbon atoms.

3. A process according to claim 1, wherein the alkylbenzimidazole compound is a compound represented by the following general formula (II):

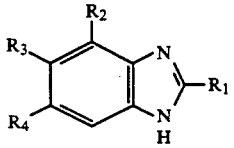

wherein $R_1$ represents an alkyl group having at least 3 carbon atoms, and $R_2$, $R_3$ and $R_4$ represent a lower alkyl group, a halogen atom, a nitro group or a hydrogen atom, with the proviso that at least one of $R_2$, $R_3$ and $R_4$ represents a lower alkyl group, a halogen atom or a nitro group.

4. A process according to claim 1, wherein the alkylbenzimidazole compound is at least one member selected from the group consisting of compounds represented by the following general formula (III) and (IV):

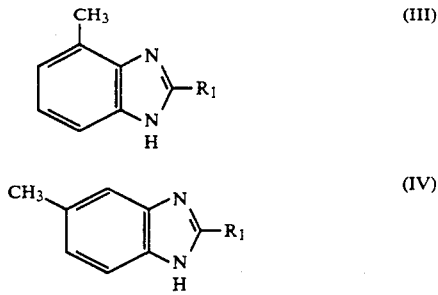

wherein $R_1$ represents an alkyl group having at least 3 carbon atoms.

5. A process for forming a chemically formed layer on the surface of copper or a copper alloy to be soldered wherein the layer protects the copper or copper alloy from oxidation upon heating, which comprises immersing the surface of copper or a copper alloy in an aqueous solution containing a benzimidazole compound and an organic acid, wherein the benzimidazole compound has an alkyl group of at least 3 carbon atoms at the 2-position and has the formula

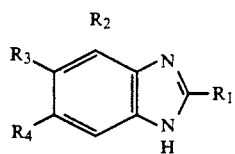

wherein $R_1$ represents an alkyl group having at least 3 carbon atoms, and $R_2$, $R_3$ and $R_4$ represent a lower alkyl group, a halogen atom, a nitro group or a hydrogen atom, and then, immersing the metal surface with an aqueous solution containing a zinc compound.

6. A process for forming a chemically formed layer on the surface of copper or a copper alloy to be soldered wherein the layer protects the copper or copper alloy from oxidation upon heating, which comprises immersing the surface of copper or copper alloy in an aqueous solution containing a benzimidazole compound, an organic acid and a zinc compound wherein the benzimidazole compound has an alkyl group of at least 3 carbon atoms at the 2-position and has the formula

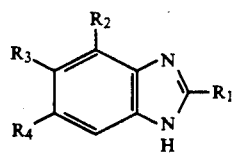

wherein $R_1$ represents an alkyl group having at least 3 carbon atoms, and $R_2$, $R_3$ and $R_4$ represent a lower alkyl group, a halogen atom, a nitro group or a hydrogen atom.

7. A process for forming a chemically formed layer on the surface of copper or copper alloy to be soldered for protecting the copper or the copper alloy from oxidation upon heating which comprises immersing the copper or copper alloy surface in an aqueous solution containing a benzimidazole compound and an organic acid, wherein the benzimidazole compound has an alkyl group of at least 3 carbon atoms at the 2-position and has the formula

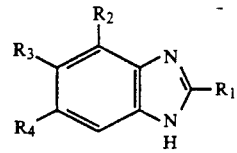

wherein $R_1$ represents an alkyl group having at least 3 carbon atoms, and $R_2$, $R_3$ and $R_4$ represent a lower alkyl group, a halogen atom, a nitro group or a hydrogen atom, and then, immersing the metal surface with an aqueous solution containing a copper compound.

8. A process for forming a chemically formed layer on the surface of copper or copper alloy to be soldered wherein the layer protects the copper or copper alloy from oxidation upon heating, which comprises immersing the copper or copper alloy surface in an aqueous solution containing a benzimidazole compound and an organic acid and a copper compound, wherein the benzimidazole compound has an alkyl group of at least 3 carbon atoms at the 2-position and has the formula

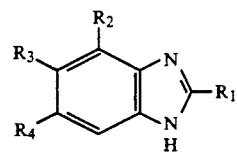

wherein $R_1$ represents an alkyl group having at least 3 carbon atoms, and $R_2$, $R_3$ and $R_4$ represent a lower alkyl group, a halogen atom, a nitro group or a hydrogen atom.

9. The process of claim 2 wherein the compound of formula (I) is selected from the group consisting of 2-propylbenzimidazole, 2-butylbenzimidazole, 2-penthylbenzimidazole, 2-hexylbenzimidazole, 2-heptylbenzimidazole, 2-octylbenzimidazole, 2-nonylbenzimidazole, 2-undecylbenzimidazole, 2-heptadecylbenzimidazole, and salts thereof.

10. The process of claim 3 wherein the benzimidazole compound of formula (II) is selected from the group consisting of 2-propyl-5-methylbenzimidazole, 2-propyl-4,5-dimethylbenzimidazole, 2-butyl-5-chlorobenzimodazole, 2-butyl-5-nitrobenzimidazole, 2-pentyl-4-methylbenzimidazole, 2-pentyl-5-methylbenzimidazole, 2-pentyl-5,6-dichlorobenzimidazole, 2-hexyl-5,6-dimethylbenzimidazole, 2-hexyl-5-nitrobenzimidazole, 2-heptyl-4-methylbenzimidazole, 2-heptyl-5-methylbenzimidazole, 2-heptyl-5-chlorobenzimidazole, 2-octyl-5,6-dichlorobenzimidazole, 2-octyl-5-chlorobenzimidazole, 2-nonyl-5-methylbenzimidazole, 2-nonyl-4,5-dimethylbenzimidazole, 2-nonyl-5-nitrobenzimidazole, 2-undecyl-4-methylbenzimidazole, 2-heptadecyl-5-methylbenzimidazole, and salts thereof.

11. A process according to claim 1 wherein the alkyl group at the 2-position of the benzimidazole compound has from 5 to 9 carbon atoms.

12. The process of claim 1 wherein the amount of the benzimidazole compound in the aqueous solution is from 0.1 to 2 percent, based on the water.

13. The process of claim 1 wherein the organic acid is selected from the group consisting of formic acid, acetic acid, lactic acid, propionic acid, capric acid, glycolic acid, acrylic acid, benzoic acid, p-nitrobenzoic acid, p-butylbenzoic acid, p-toluene-sulfonic acid, picric acid, salicylic acid, m-toluic acid, oxalic acid, succinic acid, maleic acid, fumaric acid, tartaric acid and adipic acid.

14. The process of claim 13 wherein the amount of the organic acid is from 0.2 to 4 percent, based on the water.

15. A process for forming a chemically formed layer according to claim 1, which comprises immersing the surface of the copper or the copper alloy in an aqueous solution containing 0.01 to 5% of the benzimidazole compound and 0.01 to 15% of the organic acid for a period of time of 1 second to several minutes at a temperature in the range of from about 20° C. to about 60° C.

* * * * *